(12) United States Patent
Chung et al.

(10) Patent No.: US 9,257,394 B2
(45) Date of Patent: Feb. 9, 2016

(54) SHIELD, PACKAGE STRUCTURE AND SEMICONDUCTOR PACKAGE HAVING THE SHIELD AND FABRICATION METHOD OF THE SEMICONDUCTOR PACKAGE

(71) Applicant: Siliconware Precision Industries Co., Ltd., Taichung (TW)

(72) Inventors: Kuang-Neng Chung, Taichung (TW); Hsin-Lung Chung, Taichung (TW); Tien-Chung Huang, Taichung (TW); Tsung-Hsien Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/919,176

(22) Filed: Jun. 17, 2013

(65) Prior Publication Data

US 2014/0312473 A1    Oct. 23, 2014

(30) Foreign Application Priority Data

Apr. 18, 2013   (TW) .............................. 102113754 A

(51) Int. Cl.
| | | |
|---|---|---|
| *H01L 23/552* | (2006.01) | |
| *H01L 23/32* | (2006.01) | |
| *H01L 23/31* | (2006.01) | |
| *H01L 21/56* | (2006.01) | |
| *H01L 23/00* | (2006.01) | |

(52) U.S. Cl.
CPC ............ *H01L 23/552* (2013.01); *H01L 21/561* (2013.01); *H01L 24/97* (2013.01); *H01L 2224/48091* (2013.01); *H01L 2224/48227* (2013.01); *H01L 2224/97* (2013.01); *H01L 2924/19105* (2013.01)

(58) Field of Classification Search
None
See application file for complete search history.

(56) References Cited

U.S. PATENT DOCUMENTS

| | | | | |
|---|---|---|---|---|
| 5,704,117 | A * | 1/1998 | Mok et al. ........................ | 29/841 |
| 5,838,551 | A * | 11/1998 | Chan .............................. | 361/818 |
| 6,686,649 | B1 * | 2/2004 | Mathews et al. ............... | 257/659 |
| 7,215,558 | B2 * | 5/2007 | Schultz et al. ................. | 361/816 |
| 7,488,901 | B2 * | 2/2009 | Arnold ........................... | 174/377 |
| 7,576,415 | B2 * | 8/2009 | Cha et al. ....................... | 257/659 |
| 7,989,928 | B2 * | 8/2011 | Liao et al. ...................... | 257/659 |
| 8,410,584 | B2 * | 4/2013 | An et al. ......................... | 257/660 |
| 8,653,633 | B2 * | 2/2014 | Liao et al. ...................... | 257/659 |
| 2002/0129957 | A1 * | 9/2002 | Kolb .............................. | 174/52.3 |
| 2005/0280139 | A1 * | 12/2005 | Zhao et al. ..................... | 257/704 |
| 2009/0283876 | A1 * | 11/2009 | Behun et al. ................... | 257/659 |
| 2010/0032815 | A1 * | 2/2010 | An et al. ......................... | 257/660 |
| 2011/0175210 | A1 * | 7/2011 | Yao et al. ....................... | 257/659 |

* cited by examiner

*Primary Examiner* — Joseph Schoenholtz
(74) *Attorney, Agent, or Firm* — Mintz Levin Cohn Ferris Glovsky and Popeo, P.C.; Peter F. Corless; Steven M. Jensen

(57) ABSTRACT

A fabrication method of a semiconductor package is disclosed, which includes the steps of: providing a substrate having at least a carrying region and a cutting region defined on a surface thereof, wherein the cutting region surrounds the carrying region; disposing at least an electronic element on the carrying region of the substrate; disposing a shield having a recess portion and at least a positioning member extending outwards, on the carrying region of the substrate with the electronic element received in the recess portion and the positioning member extending outwards to the cutting region; and performing a cutting process along the cutting region to remove portions of the positioning member and the substrate. Therefore, the shield is precisely positioned on the substrate.

20 Claims, 5 Drawing Sheets

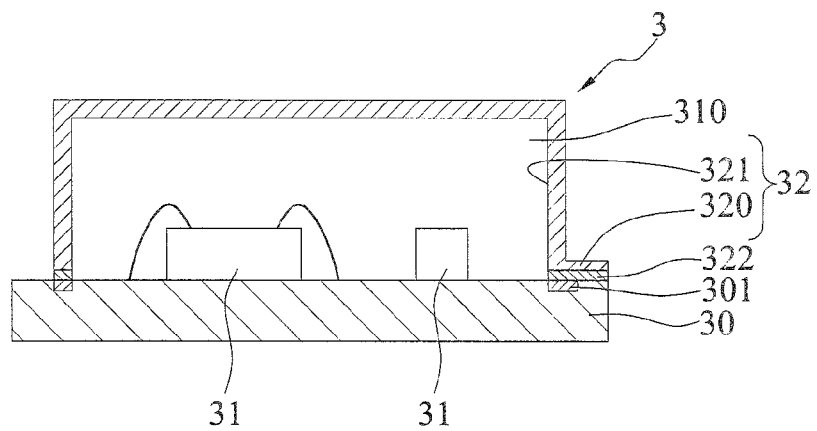
FIG.3C
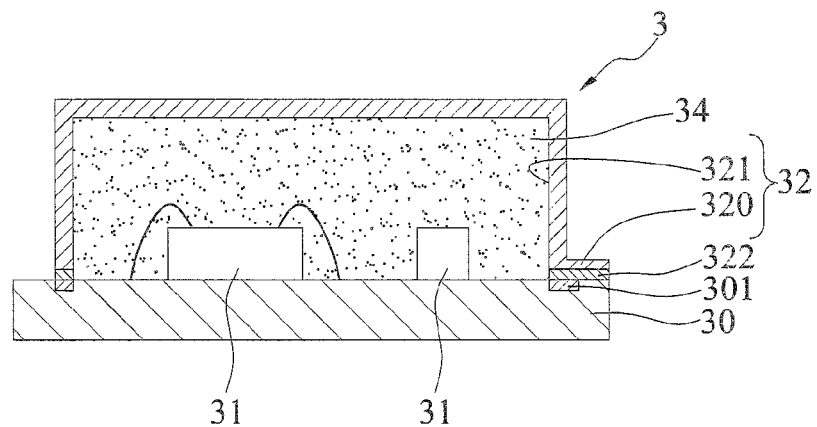
FIG.3C'
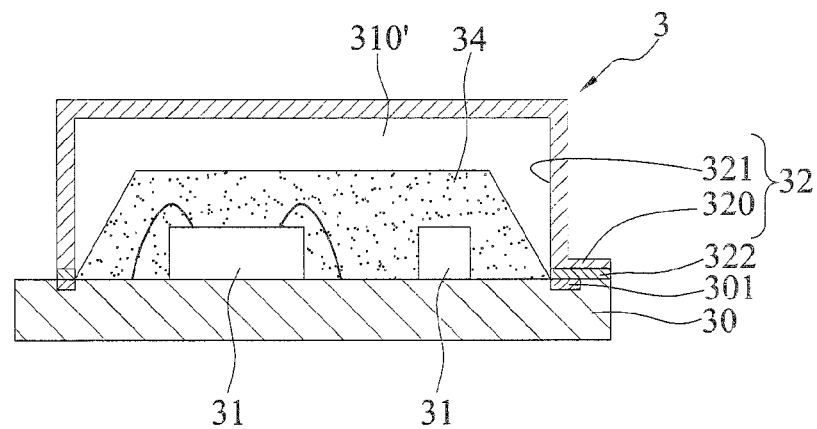
FIG.3C"

US 9,257,394 B2

SHIELD, PACKAGE STRUCTURE AND SEMICONDUCTOR PACKAGE HAVING THE SHIELD AND FABRICATION METHOD OF THE SEMICONDUCTOR PACKAGE

CROSS-REFERENCES TO RELATED APPLICATIONS

This application claims under 35 U.S.C. §119(a) the benefit of Taiwanese Application No. 102113754, filed Apr. 18, 2013, the entire contents of which is incorporated herein by reference.

BACKGROUND OF THE INVENTION

1. Field of the Invention

The present invention relates to semiconductor packages and fabrication methods thereof, and more particularly, to a semiconductor package having a shield and a fabrication method of the semiconductor package.

2. Description of Related Art

Along with the rapid development of electronic industries, electronic products are required to have light weight, small size, high speed and multi-function and accordingly semiconductor packages of the electronic products are developed towards high operational speed, high element density, high complexity and integration of multi-functional electronic elements such as biological, optical, mechanical, electo-mechanical and magnetic elements on a circuit board.

Since semiconductor packages are arranged in a high density, electromagnetic interference (EMI) easily occurs between the semiconductor packages. Accordingly, EMI shields are usually disposed at outsides of the semiconductor packages to protect the semiconductor packages against EMI.

FIGS. 1A and 1B show such a conventional semiconductor package 1. Referring to the left side of FIG. 1B, at least an electronic element 11 is disposed on a substrate 10. An EMI shield 12 is attached to the substrate 10 through a conductive adhesive layer 122 and a receiving space 110 is formed between the shield 12 and the substrate 10 for receiving the electronic element 11. However, referring to the right side of FIG. 1B, since the fabrication process of the semiconductor package 1' lacks a positioning function, the shield easily deviates from the desired position, thus reducing the product yield.

To overcome the above-describe drawback, a semiconductor package 2 that has an EMI shield and a positioning function is provided, which is shown in FIGS. 2A and 2B. Referring to FIGS. 2A and 2B, an electronic element 21 is disposed on a substrate 20 and an EMI shield 22 is attached to the substrate 20. The substrate 20 has a plurality of positioning holes 220 for positioning the shield 22. A receiving space 210 is formed between the shield 22 and the substrate 20 for receiving the electronic element 21. However, the available wiring space on the substrate 20 is reduced due to the formation of the positioning holes 220. Therefore, a larger-sized substrate 20 is required to provide sufficient wiring space, thus increasing the cost and the overall size of the semiconductor package.

Therefore, it is an urgent issue to solve the above-described drawbacks.

SUMMARY OF THE INVENTION

In view of the above-described drawbacks, the present invention provides a shield, which comprises: a recess portion having a receiving space for receiving an electronic element; and at least a positioning member extending outwards from an edge of the recess portion.

The present invention further provides a fabrication method of a semiconductor package, which comprises the steps of: providing a substrate having at least a carrying region and a cutting region defined on a surface thereof, wherein the cutting region surrounds the carrying region; disposing at least an electronic element on the carrying region of the substrate; disposing a shield having a recess portion and at least a positioning member extending outwards, on the carrying region of the substrate with the electronic element received in the recess portion and the positioning member extending outwards to the cutting region; and performing a cutting process along the cutting region to remove portions of the positioning member and the substrate.

The present invention further provides a package structure, which comprises: a substrate having at least a carrying region and a cutting region defined on a surface thereof, wherein the cutting region surrounds the carrying region; at least an electronic element disposed on the carrying region of the substrate; and a shield having a recess portion and at least a positioning member extending outwards and disposed on the carrying region of the substrate with the electronic element received in the recess portion and the positioning member extending outwards to the cutting region.

The present invention further provides a semiconductor package, which comprises: a substrate; at least an electronic element disposed on the substrate; and a shield having a recess portion and at least a positioning member extending outwards and disposed on the substrate with the electronic element received in the recess portion and an end of the positioning member flush with a side surface of the substrate.

Before disposing the shield, the method can further comprise forming an encapsulant on the substrate to encapsulate the electronic element such that after the shield is disposed on the substrate, the encapsulant is received in the recess portion of the shield. A gap can be formed between the encapsulant and the shield.

The positioning member can have a first positioning portion and the cutting region can have a second positioning portion engaging with the first positioning portion. The first and second positioning portions can be removed during the cutting process. The first positioning portion can be a pin. The second positioning portion can be a through hole or a blind via.

The carrying region of the substrate can have a plurality of ground pads around a periphery of the electronic element and the shield can be grounded to the ground pads.

Before disposing the shield, the above-described method can further comprise forming a conductive adhesive layer on the ground pads or the shield so as for the shield to be disposed on the substrate through the conductive adhesive layer. The conductive adhesive layer can be made of a conductive adhesive or solder.

The electronic element can be a chip, a package or a passive element.

Therefore, by accurately positioning the shield on the substrate through the positioning member of the shield, the present invention overcomes the conventional problem of position deviation and achieves a preferred positioning effect and an EMI-shielding effect without increasing the substrate area.

BRIEF DESCRIPTION OF DRAWINGS

FIGS. 3A to 3C are schematic views showing a fabrication method of a semiconductor package according to the present invention, wherein FIG. 3A' is a schematic cross-sectional view of FIG. 3A, FIG. 3B' is a schematic cross-sectional view of FIG. 3B, and FIGS. 3C' and 3C" show other embodiments of FIG. 3C.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "first", "second", "a" etc. are merely for illustrative purposes and should not be construed to limit the scope of the present invention.

Figure 1A:
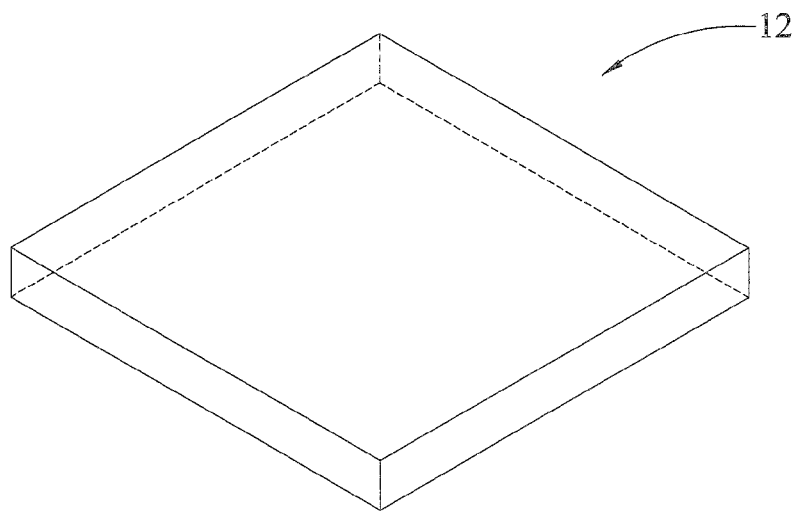
FIGS. 1A and 1B are schematic views of a conventional semiconductor package.
Figure 1B:
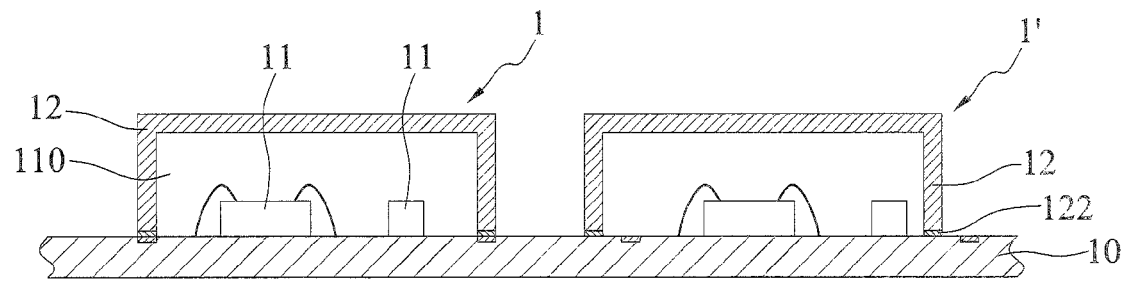
Figure 2A:
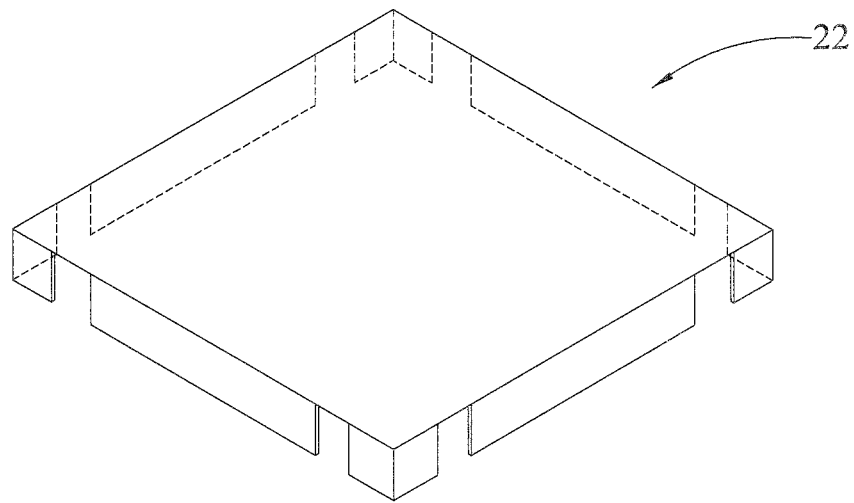
FIGS. 2A and 2B are schematic views of another conventional semiconductor package.
Figure 2B:
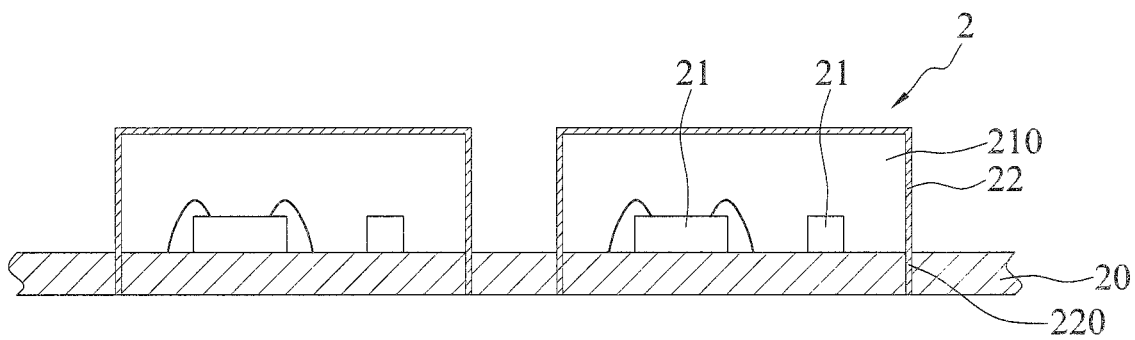
Figure 3A:
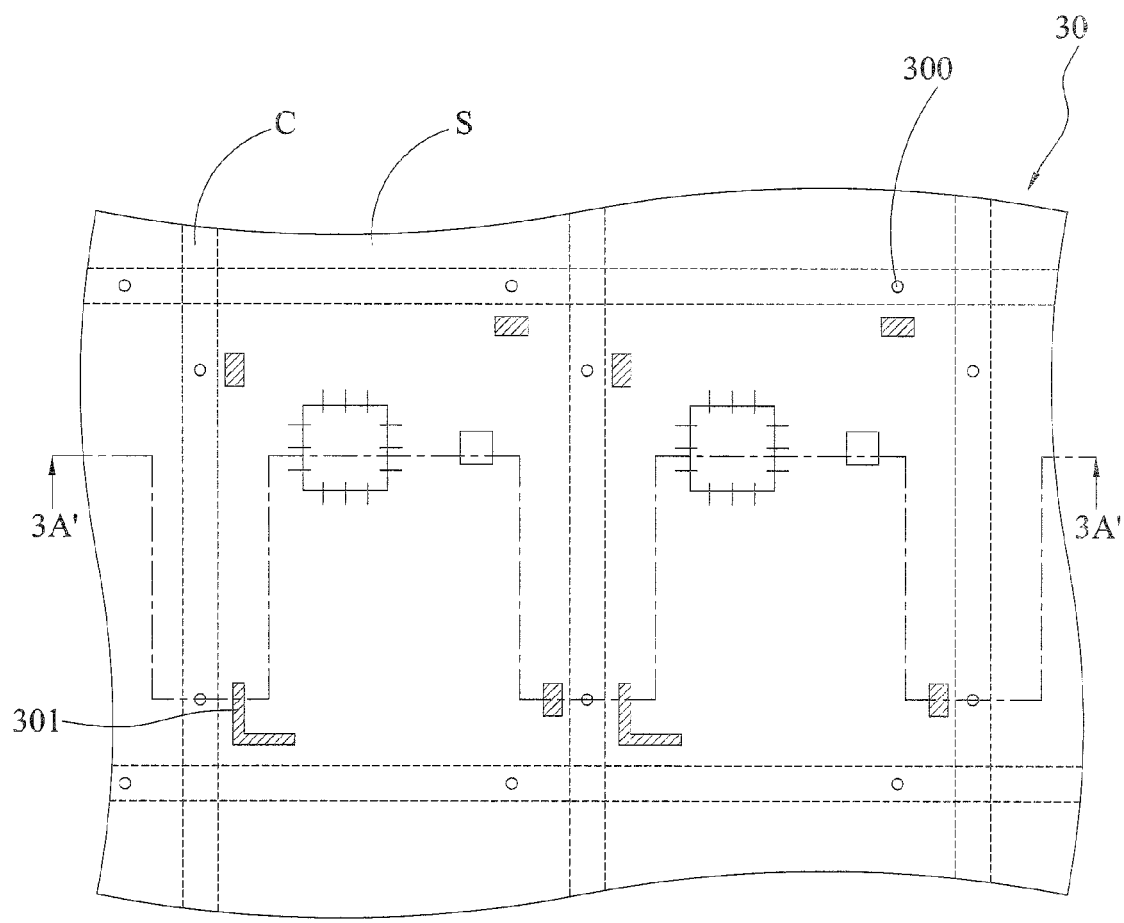
Figure 3A:
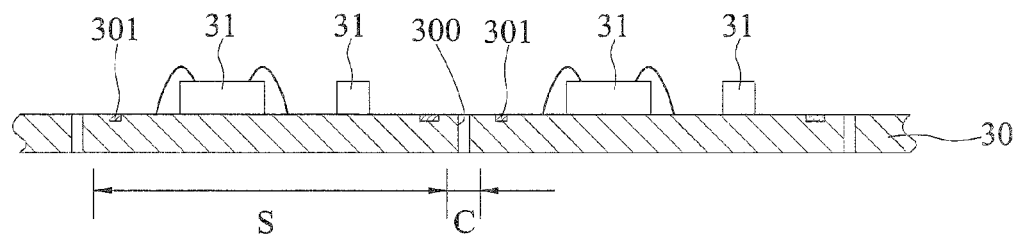
Figure 3B:
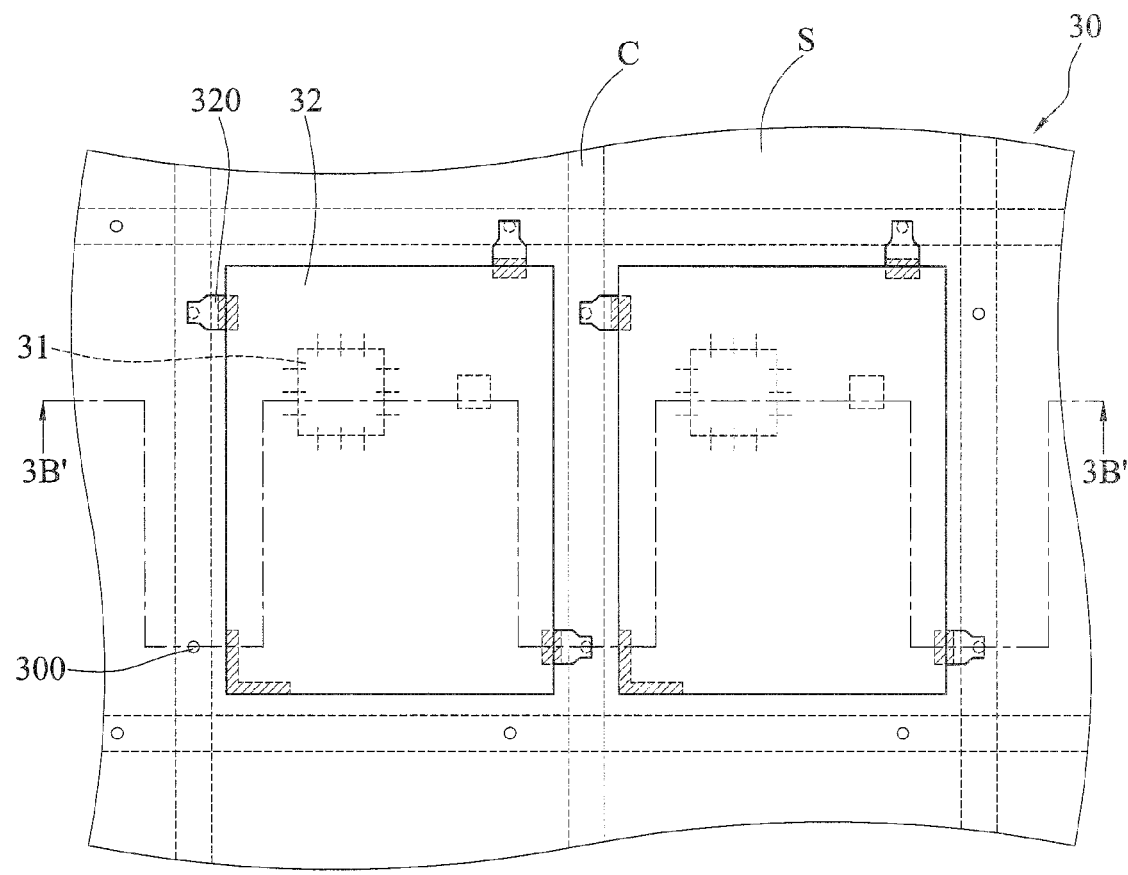
Figure 3B:
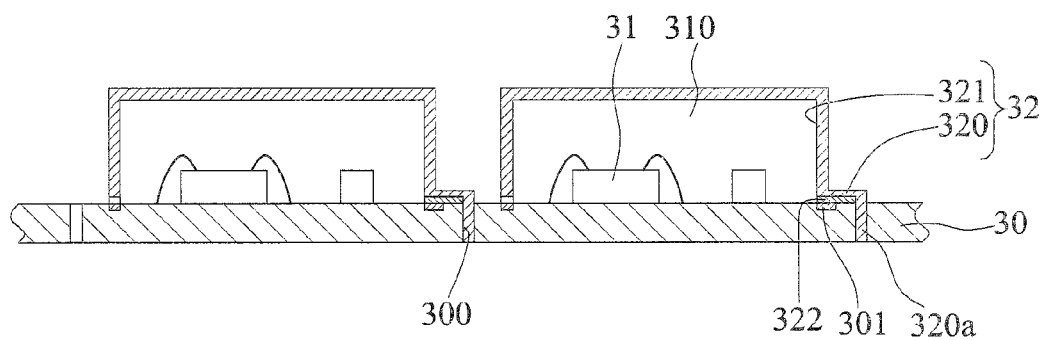

FIGS. 3A to 3C are schematic views showing a fabrication method of a semiconductor package according to the present invention, wherein FIG. 3A' is a schematic cross-sectional view taken along a sectional line 3A'-3A' of FIG. 3A, FIG. 3B' is a schematic cross-sectional view taken along a sectional line 3B'-3B' of FIG. 3B, and FIGS. 3C' and 3C" show other embodiments of FIG. 3C.

Referring to FIGS. 3A and 3A', a substrate 30 is provided, and at least a carrying region S and a cutting region C surrounding the carrying region S are defined on a surface of the substrate 30. At least an electronic element 31 is disposed on the substrate 30. A plurality of ground pads 301 are formed along a periphery of the carrying region S and a plurality of second positioning portions 300 are formed in the cutting region C of the substrate 30.

In the present embodiment, the second positioning portions 300 are through holes to be used for positioning a shield. But it should be noted that the second positioning portions 300 are not limited thereto. In another embodiment, the second positioning portions 300 can be blind vias. The electronic element 31 is a chip, a package or a passive element.

Referring to FIGS. 3B and 3B', a shield 32 having a recess portion 321 and a plurality of positioning members 320 extending outwards is provided. The shield 32 is disposed on the carrying region S of the substrate 30 such that a receiving space 310 is formed between the recess portion 321 of the shield 32 and the carrying region S for receiving the electronic element 31 and the positioning members 320 extend outwards to the cutting region C.

In the present embodiment, each of the positioning members 320 has a first positioning portion 320a for engaging with a corresponding one of the second positioning portions 300 of the substrate 30. For example, the first positioning portion 320a is a pin that can be inserted into the corresponding second positioning portion 300 (through hole or blind via) for positioning the shield 32. Further, a conductive adhesive layer 322 is formed on the ground pads 301 or the shield 32 so as for the shield 32 to be disposed on the substrate 30 through the conductive adhesive layer 322. The conductive adhesive layer 322 can be made of a conductive adhesive or solder. The shield 32 has an EMI shielding function.

Referring to FIG. 3C, continued from FIG. 3B, a cutting process is performed along the cutting region C to remove portions of the positioning members 320 and the substrate 20, thereby obtaining a semiconductor package 3. In particular, the first positioning portions 320a of the positioning members 320, the second positioning portions 300 corresponding to the first positioning portions 320a, and a portion of the cutting region C of the substrate 30 are removed through the cutting process.

Referring to FIGS. 3C' and 3C", before the shield 32 is disposed on the substrate 30, an encapsulant 34 can be formed on the substrate 30 to encapsulate the electronic element 31. The shield 32 is then disposed on the substrate 30 to encapsulate the encapslant 34. Alternatively, a gap 310' can be formed between the shield 32 and the encapsulant 34. Since the method and material for forming the encapsulant 34 are well known in the art, detailed description hereof is omitted herein.

The present invention further provides a semiconductor package, which has: a substrate 30; at least an electronic element 31 disposed on the substrate 30; and a shield 32 disposed on the substrate 30. The shield 32 has a recess portion 321 and at least a positioning member 320 extending outwards, and the shield 32 is disposed on the substrate 30 with the electronic element 31 received in the recess portion 321 and an end of the positioning member 320 flush with a side surface of the substrate 30.

The semiconductor package 3 further has an encapsulant 34 formed on the substrate 30 to encapsulate the electronic element 31. The encapsulant 34 can be encapsulated by the shield 32, or a gap 310' can be formed between the shield 32 and the encapsulant 34.

The substrate 30 further has a plurality of ground pads 301 around a periphery of the electronic element 31. A conductive adhesive layer 322 is formed between the ground pads 301 and the shield 32 such that the shield 32 is attached to and grounded to the ground pads 301 through the conductive adhesive layer 322. The electronic element 31 is a chip, a package or a passive element.

The present invention accurately positions the shield on the substrate by engaging the positioning member of the shield with the second positioning portion on the cutting region of the substrate, thus achieving an EMI-shielding effect and improving the positioning precision without increasing the substrate area. Consequently, the product yield is improved.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:

providing a substrate having at least a carrying region and a cutting region defined on a surface thereof, wherein the cutting region surrounds the carrying region;

disposing at least an electronic element on the carrying region of the substrate;

disposing a shield having a recess portion and at least a positioning member extending outwards, on the carrying region of the substrate with the electronic element received in the recess portion and the positioning member extending outwards to the cutting region, wherein the positioning member has a first positioning portion, the cutting region has a second positioning portion engaging with the first positioning portion and the second positioning portion is a through hole or a blind via; and performing a cutting process along the cutting region to remove the first positioning portion of the positioning member and the second positioning portion of the substrate.

2. The method of claim 1, wherein the first positioning portion is a pin.

3. The method of claim 1, wherein the carrying region of the substrate has a plurality of ground pads around a periphery of the electronic element and the shield is grounded to the ground pads.

4. The method of claim 3, before disposing the shield, further comprising forming a conductive adhesive layer on the ground pads or the shield so as for the shield to be disposed on the substrate through the conductive adhesive layer.

5. The method of claim 4, wherein the conductive adhesive layer is made of a conductive adhesive or solder.

6. The method of claim 1, before disposing the shield, further comprising forming an encapsulant on the substrate to encapsulate the electronic element, such that after the shield is disposed on the substrate, the encapsulant is received in the recess portion of the shield.

7. The method of claim 6, wherein a gap is formed between the shield and the encapsulant.

8. The method of claim 1, wherein the electronic element is a chip, a package or a passive element.

9. A semiconductor package, comprising:
   a substrate;
   at least an electronic element disposed on the substrate;
   a shield having a recess portion and at least a positioning member extending outwards and disposed on the substrate with the electronic element received in the recess portion and an end of the positioning member flush with a side surface of the substrate, wherein the positioning member has a first positioning portion engaging a through hole or a blind via; and
   an encapsulant formed on the substrate for encapsulating a top surface and side surfaces of the electronic element, wherein a gap is formed between the shield and the top surface of the encapsulant and between the shield and the side surfaces of the encapsulant.

10. The package of claim 9, wherein the electronic element is a chip, a package or a passive element.

11. The package of claim 9, wherein the substrate has a plurality of ground pads around a periphery of the electronic element and the shield is grounded to the ground pads.

12. The package of claim 11, further comprising a conductive adhesive layer formed between the ground pads and the shield so as for the shield to be disposed on the substrate through the conductive adhesive layer.

13. A package structure, comprising:
   a substrate having at least a carrying region and a cutting region defined on a surface thereof, wherein the cutting region surrounds the carrying region;
   at least an electronic element disposed on the carrying region of the substrate; and
   a shield having a recess portion and at least a positioning member extending outwards and disposed on the carrying region of the substrate with the electronic element received in the recess portion and the positioning member extending outwards to the cutting region, wherein the positioning member has a first positioning portion, the cutting region has a second positioning portion engaging with the first positioning portion and the second positioning portion is a through hole or a blind via.

14. The structure of claim 13, wherein the first positioning portion is a pin.

15. The structure of claim 13, wherein the carrying region of the substrate has a plurality of ground pads around a periphery of the electronic element, and the shield is grounded to the ground pads.

16. The structure of claim 15, further comprising a conductive adhesive layer formed between the ground pads and the shield so as for the shield to be disposed on the substrate through the conductive adhesive layer.

17. The structure of claim 16, wherein the conductive adhesive layer is made of a conductive adhesive or solder.

18. The structure of claim 13, further comprising an encapsulant formed on the substrate to encapsulate the electronic element.

19. The structure of claim 18, wherein a gap is formed between the shield and the encapsulant.

20. The structure of claim 13, wherein the electronic element is a chip, a package or a passive element.

* * * * *